United States Patent
Kaps

(10) Patent No.: US 10,155,195 B2
(45) Date of Patent: Dec. 18, 2018

(54) MONITORING SYSTEM FOR ANNULAR SCRUBBERS

(71) Applicant: Primetals Technologies Austria GmbH, Linz (AT)

(72) Inventor: Gareth Kaps, Darlington (GB)

(73) Assignee: PRIMETALS TECHNOLOGIES AUSTRIA GMBH (AT)

(*) Notice: Subject to any disclaimer, the term of this patent is extended or adjusted under 35 U.S.C. 154(b) by 97 days.

(21) Appl. No.: 15/509,900

(22) PCT Filed: Sep. 24, 2015

(86) PCT No.: PCT/EP2015/071991
§ 371 (c)(1),
(2) Date: Mar. 9, 2017

(87) PCT Pub. No.: WO2016/050604
PCT Pub. Date: Apr. 7, 2016

(65) Prior Publication Data
US 2017/0296966 A1    Oct. 19, 2017

(30) Foreign Application Priority Data
Sep. 30, 2014   (GB) .................................. 1417289.4

(51) Int. Cl.
*B01D 19/04*  (2006.01)
*B01D 45/00*  (2006.01)
(Continued)

(52) U.S. Cl.
CPC ............. *B01D 53/78* (2013.01); *B01D 19/04* (2013.01); *B01D 47/06* (2013.01); *B01D 47/10* (2013.01);
(Continued)

(58) Field of Classification Search
CPC ............... B01D 19/04; B01D 2247/08; B01D 2258/02; B01D 45/00; B01D 47/06;
(Continued)

(56) References Cited

U.S. PATENT DOCUMENTS

| | | | |
|---|---|---|---|
| 3,199,267 A * | 8/1965 | Hausberg | B01D 47/00 96/253 |
| 4,093,434 A | 6/1978 | Hausberg et al. | 55/226 |
| 4,375,439 A | 3/1983 | Hegemann et al. | 261/62 |

FOREIGN PATENT DOCUMENTS

GB    2 081 125 A    2/1982

OTHER PUBLICATIONS

International Search Report dated Dec. 14, 2015 in corresponding PCT International Application No. PCT/EP2015/071991.
(Continued)

*Primary Examiner* — Cabrena Holecek
(74) *Attorney, Agent, or Firm* — Ostrolenk Faber LLP

(57) ABSTRACT

A gas scrubber cone condition monitoring system has a sealed gas scrubber cone (9) moveably mounted in a gas pipe (1), a collar (5) fixedly mounted radially outward of the cone in the gas pipe and a pressure tap (12) into the sealed cone. The pressure tap is coupled to a condition monitor (17, 18) via an input line (16). An output line (14) from the condition monitor is coupled to a gas pipe (15), downstream of the sealed cone. The condition monitor includes at least one of a pressure gauge and a gas flow meter.

10 Claims, 3 Drawing Sheets

(51) Int. Cl.
*B01D 53/78* (2006.01)
*B01J 8/00* (2006.01)
*C01B 3/00* (2006.01)
*C30B 25/14* (2006.01)
*B01D 47/06* (2006.01)
*B01D 47/10* (2006.01)
*C21B 5/00* (2006.01)
*C21B 5/06* (2006.01)
*C21B 7/00* (2006.01)
*C21B 7/22* (2006.01)

(52) U.S. Cl.
CPC ............... *B01J 8/003* (2013.01); *C21B 5/006* (2013.01); *C21B 5/06* (2013.01); *C21B 7/005* (2013.01); *C21B 7/007* (2013.01); *C21B 7/22* (2013.01); *C30B 25/14* (2013.01); *B01D 45/00* (2013.01); *B01D 2247/08* (2013.01); *B01D 2258/02* (2013.01); *C01B 3/00* (2013.01); *C21B 2100/44* (2017.05); *Y02P 10/283* (2015.11); *Y02P 10/286* (2015.11)

(58) Field of Classification Search
CPC .......... B01D 47/10; B01D 53/78; B01J 8/003; C01B 3/00; C21B 2100/44; C21B 5/006; C21B 5/06; C21B 7/005; C21B 7/007; C21B 7/22; C30B 25/14; Y02P 10/283; Y02P 10/286
See application file for complete search history.

(56) References Cited

OTHER PUBLICATIONS

Written Opinion dated Dec. 14, 2015 in corresponding PCT International Application No. PCT/EP2015/071991.
Combined Search and Examination Report dated Mar. 26, 2015 in corresponding United Kingdom Patent Application No. 1417289.4.

\* cited by examiner

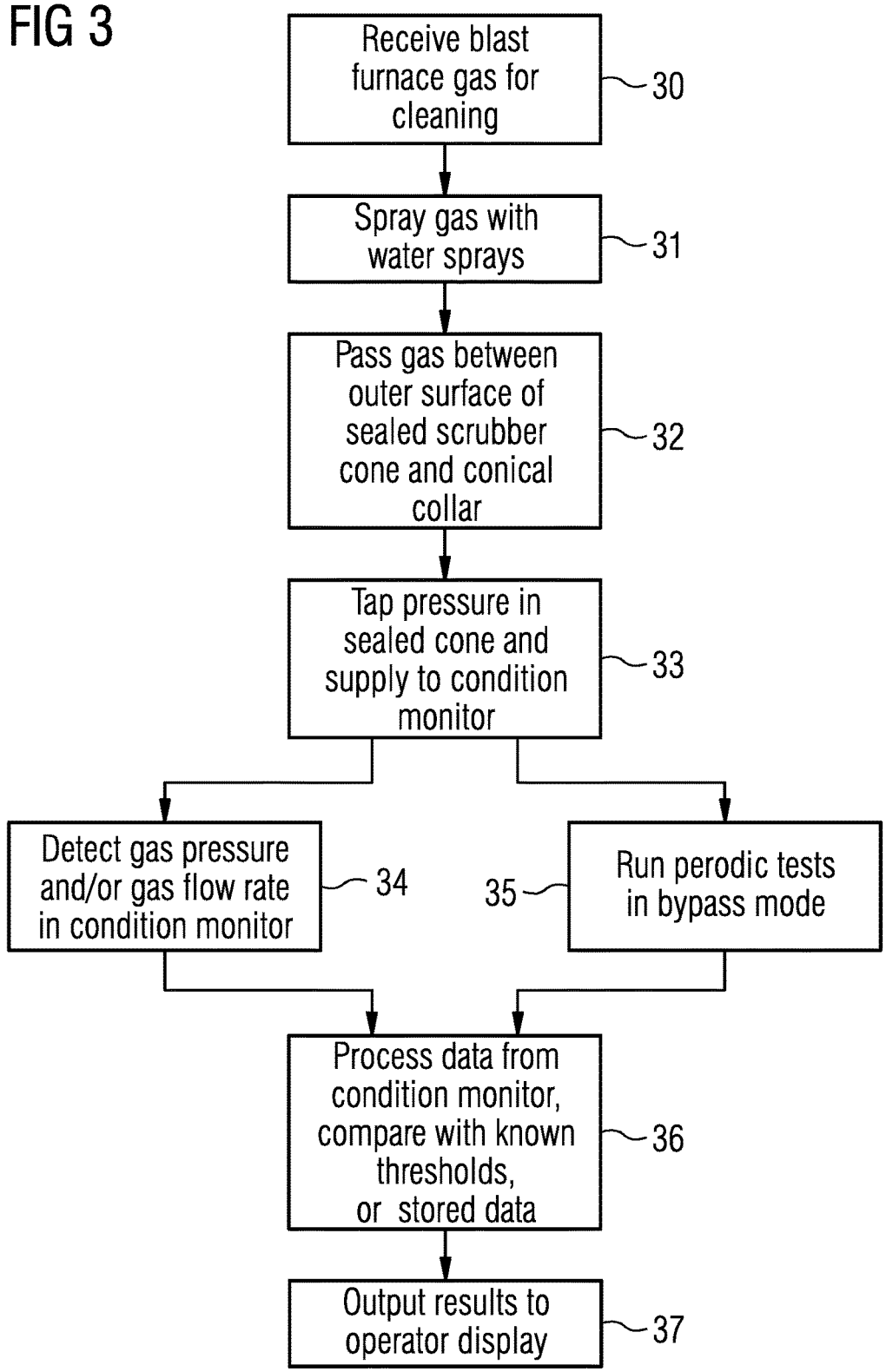

MONITORING SYSTEM FOR ANNULAR SCRUBBERS

CROSS-REFERENCE TO RELATED APPLICATIONS

The present application is a 35 U.S.C. §§ 371 national phase conversion of PCT/EP2015/071991, filed Sep. 24, 2015, which claims priority of United Kingdom Patent Application No. 1417289.4, filed Sep. 30, 2014, the contents of which are incorporated by reference herein. The PCT International Application was published in the English language.

TECHNICAL FIELD

This invention relates to a condition monitor, in particular for a gas cleaning scrubber.

TECHNICAL BACKGROUND

Blast furnace gas cleaning plants generally use a moving cone arrangement to control blast furnace top gas pressure and enable gas cleaning. The moving cone arrangement comprises an inverted cone having an open bottomed shell with supporting framework which is used to control gas flow and locally increase gas velocity as it passes over the cone. This improves trapping of dust particles in water droplets formed by water sprays impinging on the cone.

The arduous operating environment in this part of the blast furnace means that the cone is susceptible to both chemical attack and erosion. The cone is manufactured from materials chosen to maximise cone life, but the cone shell eventually fails. It is difficult to diagnose failure of the cone shell before it reaches a stage which starts to adversely affect plant performance, as the way the cone controls gas flow and maintains pressure means that it automatically compensates for minor wear in the cone shell. The first sign of failure of the cone shell may be by a gas monitoring sensor downstream detecting that the gas is getting dirtier again, but periodic inspections requiring a plant shutdown and isolation remain the most common condition monitoring method.

SUMMARY OF THE INVENTION

In accordance with a first aspect of the present invention, a gas scrubber cone condition monitoring system comprises a condition monitor; a sealed gas scrubber cone moveably mounted in a gas vessel; a collar fixedly mounted radially outward of the cone in the gas pipe; a pressure tap into the sealed cone, the pressure tap coupled to the condition monitor via an input line; an output line from the condition monitor to a gas vessel, downstream of the sealed cone; wherein the condition monitor comprises at least one of a pressure gauge and a gas flow meter.

Preferably, the system further comprises a changeover valve between the condition monitor and the downstream gas area. The valve is adapted to switch the condition monitor output line between ambient pressure and the downstream gas pipe pressure.

Preferably, the sealed gas scrubber cone comprises a gas scrubber cone and a baseplate forming a sealed enclosure in the scrubber cone.

Preferably, the gas area downstream of the sealed cone comprises a gas area for clean gas.

In accordance with a second aspect of the present invention, a method of scrubber cone condition monitoring comprises sealing a scrubber cone to form a sealed enclosure for use with a scrubber; inserting a pressure tap into the sealed cone; measuring pressure in the sealed cone in a condition monitor; comparing the measured pressure with an expected sealed cone pressure value; and providing an indication of a fault condition if the result of the comparison exceeds a predefined value.

Preferably, the expected pressure value is a stored design pressure for the cone being monitored or is derived from previous pressure measurements.

Preferably, the measured pressure is recorded and stored at intervals during operation of the scrubber; and the predefined value is derived from all stored records taken over a given time period.

Preferably, the method further comprises switching an output end of the pressure tap between two locations at different pressures to obtain distinct changes in gas flow measurements.

Preferably, the locations comprise a clean gas area of the scrubber and a location external to the scrubber at ambient pressure.

BRIEF DESCRIPTION OF THE DRAWINGS

An example of a condition monitor and a method of monitoring the condition of a gas cleaning system in accordance with the present invention will now be described with reference to the accompanying drawings in which.

DESCRIPTION OF AN EMBODIMENT

Figure 1:
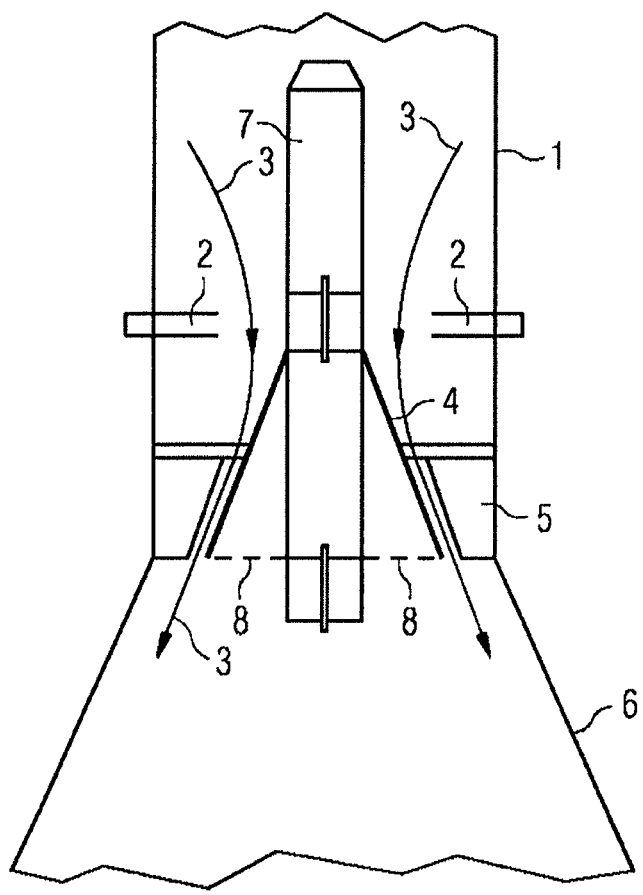
FIG. 1 illustrates an example of a conventional gas scrubber cone arrangement.

In a conventional gas scrubber, for example as illustrated in FIG. 1, gas to be cleaned is supplied through a pipe from the blast furnace to a scrubber comprising an inner cone 4 and an outer collar 5, wherein the outer collar has a conical surface and is fitted inside a vessel 1. The conical surface of the outer collar typically has a different angle of inclination relative to the conical surface of the inner cone with which it co-operates in order to achieve a reducing flow area and an increasing gas velocity. In practice, the cone is typically mounted on a moveable support and is sealed at the top to that support, so the shape is actually frusto-conical. An annular gap is formed between the outer surface of the inner cone and the conical surface of the collar, so that gas is able to flow through into an outlet area 6. The cone has solid walls, but is vented at the bottom 8 into the outlet area 6. The cone 4 is mounted on a movable support, coupled to a controller (not shown) to enable the cone to be moved up and down within the collar according to the gap size required. Generally, it is desirable to maintain a constant top gas pressure, which can be done by moving the cone in the annular collar to increase or decrease the opening between the outer surface of the cone and the inner surface of the collar, through which gas can flow. Detection of a pressure drop measured in the dirty gas system, upstream of the cone, causes the cone to move up to reduce the annular gap between the cone and the collar and so maintain the top gas pressure. Conversely detection of an increase in pressure causes the cone to move down to increase the annular gap.

The gas scrubber receives second stage gas which has been partially cleaned, but still has some particulate matter which needs to be removed. Radial water sprays 2 spray the received blast furnace gas with water before the gas passes through the gap between the cone 4 and the collar 5. The gas flow path is illustrated by arrows 3. The particulate material in the gas is abrasive and the water sprays are intended to fully wet the outer surface of the cone, forming a cushioning layer on the cone over which the abrasive material passes. However, even with this protection, eventually, the cone wears and needs replacement, which requires the system to be shut down and the scrubber dismantled. Particulates in the gas stream are intercepted by water droplets, entraining the particle in the droplet which falls to a sump and is further filtered to remove dust particles.

Figure 2:
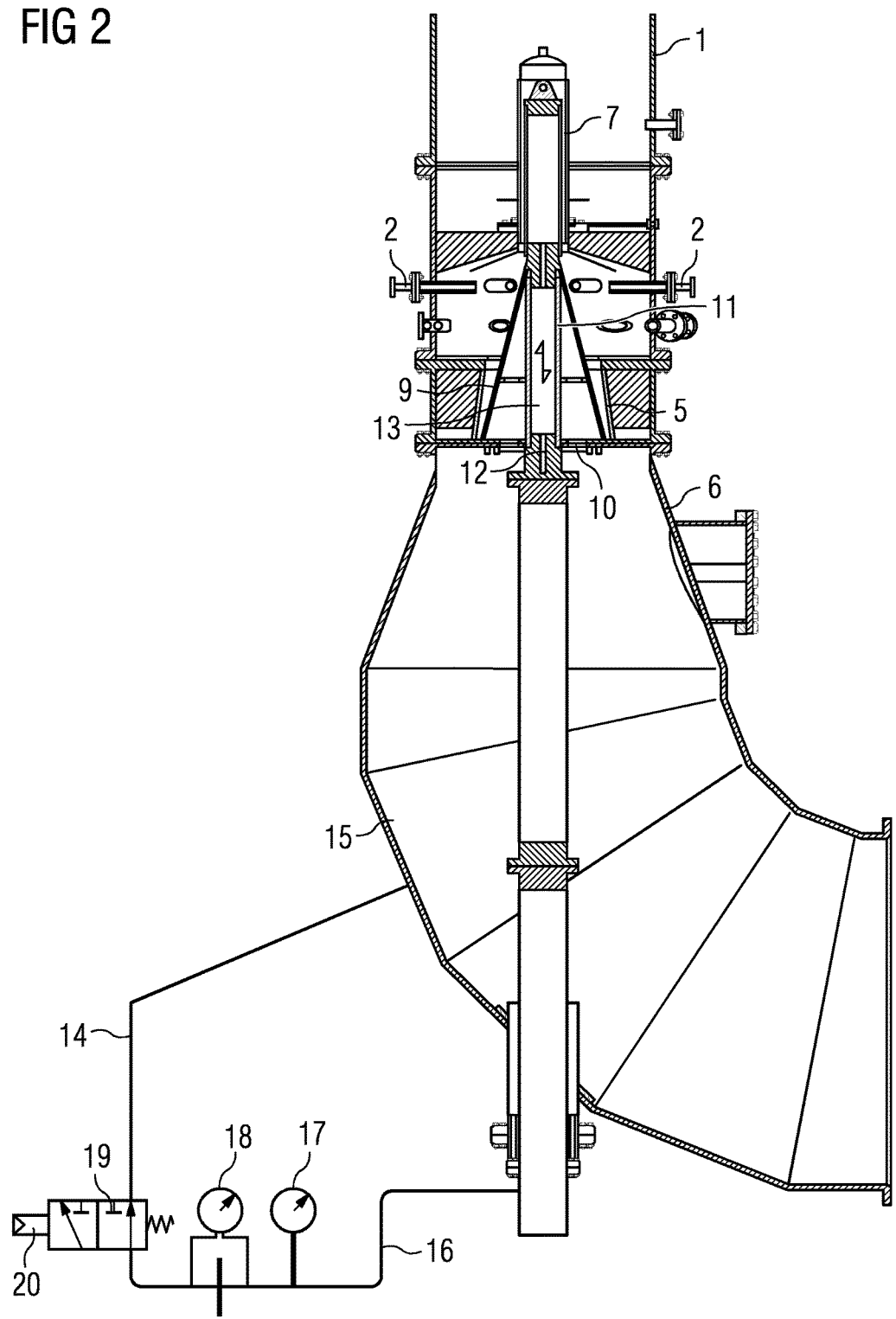
FIG. 2 illustrates an example of a condition monitoring system according to the present invention; and, FIG. 3 is a flow diagram illustrating a method according to the present invention, for monitoring the condition of a gas cleaning system.

FIG. 2 illustrates an example of a cone condition monitoring system according to the present invention for a gas scrubber. As before, gas for cleaning is received from the blast furnace in inlet vessel, or pipe 1 and is directed past water sprays 2 and along a path between an outer surface of a scrubber cone 9 and a conical collar 5. The cone 9 has a sealed cavity with solid walls and a solid base 10, rather than the vented base of the prior art. This feature is one which not only can be built into scrubber cone systems, but can be retrofitted to give a relatively low cost solution to the problem of scrubber cone failure. A pressure tap is drilled in the cone shaft 11 going down the cone shaft and being picked up outside of the pressure envelope. At the other end, the connection 14 may be connected to the clean gas area 15 inside the scrubber shell 6, preventing damage from occurring due to a pressure differential on the cone 9. In the line 16 from the cone shaft near the drive cylinder to the clean gas area a pressure gauge 17 and gas flow meter 18 are provided. An orifice type flow meter is shown in FIGS. 1 and 2, but other types of gas flow measurement may be employed. A changeover valve 19 in the line 16 with a vent to a safe location allows a second test procedure to be activated. If cone leakage is taking place to the upper, higher pressure side of the scrubber, this will appear as a flow in the line 16 measured at the flow meter 18 due to the differential pressure across the cone. The changeover valve 19 allows for a second test, carried out periodically, whereby the tapping is transferred to the vent and through the flow meter 18. Any cone leakage, either present on the upper surface of the cone or lower 'closing' surface shows as a measurable flow and pressure in the flow meter 18 or pressure gauge 17. The amount of flow and pressure give an indication of the place and size of the hole in the cone 9—the higher the flow rate, the larger the hole. The changeover valve allows a comparison of cone pressure to either the lower or upper chamber pressures. In standard scrubber operation, there will be a pressure drop across the cone and therefore by comparing the cone pressure to the upper and lower chamber pressures, an approximate location of any perforation may be inferred.

Setting up the condition monitoring system of the present invention requires drilling an opening in the cone shaft for the pressure tapping and manufacturing the cone cavity as a sealed cavity, for example by welding a closure member in the lower part of the cone to seal the cone cavity. The pressure tap is then connected to either the lower chamber or atmospheric pressure. This contrasts with conventional open cone systems which are deliberately vented to prevent over or under pressure due to temperature changes.

A method of scrubber cone condition monitoring according to the present invention is illustrated in FIG. 3. Blast furnace gas, which has typically already passed through one or more cleaning processes, such as a dustcatcher or cyclone installed upstream of the scrubber and a condition tower before the gas is supplied 30 through the gas supply pipe to the scrubber. At the entry to the scrubber, the gas is sprayed 31 with water sprays to provide cushioning and lubrication of the particles contained in the gas as they pass through the scrubber. The wetted particulate and gas passes 32 through the opening formed between the outer surface of the scrubber cone and the inner surface of the collar in the gas pipe. A pressure tap 33 into the sealed scrubber cone is connected to the condition monitor, so that pressure within the cone can be monitored. Any sudden change of pressure indicates a perforation of the sealed cone. As well as gas pressure, gas flow rate may be detected 34 by the condition monitor, according to the type of meters in the monitor. Periodically, the flow may be switched 35 to a bypass output at ambient pressure, rather than the line from the condition monitor being connected to the outlet clean gas area of the scrubber shell, downstream of the cone and the gas flow rate data used to provide further diagnostic information such as the extent of perforation or the size of leakage. In one example, a perforation in the lower face of the sealed cone presents a small, but measurable, pressure change inside the cone due to the gas velocities around the cone. Gas flow when connected to the clean gas area of the scrubber is low, but if connected to ambient pressures externally, flow will be initiated through the positive pressure of the clean gas when compared to ambient. The magnitude of this flow indicates the severity of the perforation. Data is processed 36 in a processor of the condition monitor and comparison of detected pressures with expected pressure thresholds for the cone in question, or previously recorded and averaged pressure readings taken over a period of time may be made. If the comparison shows significant deviation from the expected or averaged values, an alert may be output 37 to the operator, in addition to any running data display that is output, in order to draw attention to the potential problem.

The invention modifies the design of the scrubber cone to create a sealed enclosure, and uses internal gas pressure and/or flow measurements to monitor the condition of the cone. This allows certain condition monitoring indications to be derived using the pressure differential across the cone in operation. In addition to the diagnostic possibilities, a sealed cone enclosure is less susceptible to further damage following perforation due to reduced gas flow through the perforation when compared to existing designs. By this method, any perforation of the sealed enclosure can be detected far earlier than is possible with current methods, and so allows operators to plan and implement corrective action before plant performance is adversely affected.

In one embodiment, simple internal pressure measurement of the cone enclosure identifies any sudden change in pressure indicative of a perforation to the pressure envelope. In a further embodiment, in addition to the basic identification of enclosure perforation, identifying the nature of the change in cone condition allows limited diagnosis of problem areas without plant shutdown, or isolation and visual inspection. As described above, the cone enclosure of FIG. 2 may be connected to a switchable location, such as either the 'clean gas' area of the scrubber tower, or externally and by detecting the ambient pressures externally through a range of measuring instruments, it is possible to use gas flow measurement in addition to simple pressure to provide further diagnostic data. A perforation in the conical surface of the enclosure presents a major change in internal pressure and initiates measurable flow into the clean gas area. The magnitude of this flow provides an indication of the severity of the perforation.

The present invention uses a scrubber cone which has been designed to create a sealed enclosure, rather than the open cone structure of prior art systems. Gas pressure measurement within the sealed enclosure may then be used to indicate the condition of the enclosure and gas flow from the enclosure under 'known conditions' may be used to provide further condition monitoring or diagnostics data. The invention thus provides improved monitoring of cone condition, increasing the time available for planning and implementation of repairs before plant operation is affected. Furthermore, improved diagnostics are possible through interrogation of data, improving the chances of successful corrective action and minimising shutdown periods required to complete repair works. The invention provides a design which is more resilient to further damage following initial cone perforation, than conventional designs. The sealed cone design is a relatively inexpensive solution which can be retrofitted, as the bottom plate can be added to existing cones and helps to maintain performance even when the cone wears.

The invention claimed is:

1. A gas scrubber cone condition monitoring system comprising:
   a gas vessel through which gas flows from upstream to downstream;
   a sealed gas scrubber cone moveably mounted in the gas vessel; the cone has a narrower end upstream in the gas vessel and a wider end downstream in the gas vessel; the cone comprises the gas scrubber cone and a baseplate over the wider end of the cone for forming a sealed enclosure in the cone;
   a condition monitor comprising at least one of a pressure gauge and a gas flow meter;
   a pressure tap into the sealed cone, an input line coupling the pressure tap to the condition monitor;
   an output line from the condition monitor to a downstream gas area, downstream of the sealed cone; and
   a collar fixedly mounted radially outward of and opposing the cone in the gas vessel for defining a passage for the gas between the collar and the cone, and such that movement of the cone in the gas vessel adjusts the flow and the pressure of the gas passing the cone.

2. A system according to claim 1, further comprising:
   a changeover valve between the condition monitor and the downstream gas area, the valve being configured to switch the condition monitor output line between ambient pressure and the downstream gas area pressure.

3. A system according to claim 1, further comprising the gas area in the vessel downstream of the sealed cone comprising a gas area for clean gas.

4. A method of scrubber cone condition monitoring, comprising:
   providing a sealed scrubber cone for use with a gas scrubber wherein the sealed scrubber cone comprises a gas scrubber cone and a baseplate over a wider end of the cone for forming a sealed enclosure in the cone;
   inserting a pressure tap into the sealed cone enclosure; and
   measuring pressure in the sealed cone at a condition monitor; comparing the measured pressure with an expected sealed cone pressure value; and providing an indication of a fault condition if the result of the comparison exceeds a predefined value.

5. A method according to claim 4, wherein the expected pressure value is a stored design pressure for the cone being monitored, or is derived from previous pressure measurements in the cone being monitored.

6. A method according to claim 4, further comprising:
   recording the measured pressure and storing the measured pressure at intervals during operation of the scrubber; and
   deriving the predefined value from stored records taken over a given time period.

7. A method according to claim 4, further comprising:
   switching an output end of the pressure tap between two locations at different pressures to obtain distinct changes in gas flow measurements.

8. A method according to claim 7, wherein the two locations comprise a clean gas area of the scrubber and a location external to the scrubber at ambient pressure.

9. The system according to claim 1, further comprising liquid spray nozzles supported and configured to spray liquid toward the gas flowing through the vessel before the gas passes by the cone.

10. The system according to claim 9, wherein the liquid is water.

* * * * *